United States Patent
Nagase et al.

(10) Patent No.: US 8,415,565 B2
(45) Date of Patent: Apr. 9, 2013

(54) MULTILAYER CIRCUIT SUBSTRATE

(75) Inventors: Shigeki Nagase, Nabari (JP); Motoo Nakai, Nara (JP); Kouya Yoshida, Kobe (JP); Hiroshi Sumasu, Kashihara (JP); Nobuhiro Uchida, Yamatotakada (JP)

(73) Assignee: JTEKT Corporation, Osaka (JP)

( * ) Notice: Subject to any disclaimer, the term of this patent is extended or adjusted under 35 U.S.C. 154(b) by 331 days.

(21) Appl. No.: 12/585,293

(22) Filed: Sep. 10, 2009

(65) Prior Publication Data

US 2010/0065307 A1 Mar. 18, 2010

(30) Foreign Application Priority Data

Sep. 17, 2008 (JP) ................................. 2008-237471

(51) Int. Cl.
*H05K 1/00* (2006.01)

(52) U.S. Cl. ......... 174/252; 174/548; 361/760; 361/783

(58) Field of Classification Search .................. 174/260, 174/255, 252, 265, 520, 547, 548; 361/760, 361/761, 781–783
See application file for complete search history.

(56) References Cited

U.S. PATENT DOCUMENTS

| | | | |
|---|---|---|---|
| 4,737,395 A * | 4/1988 | Mabuchi et al. | 428/138 |
| 4,993,148 A * | 2/1991 | Adachi et al. | 29/832 |
| 5,754,402 A | 5/1998 | Matsuzaki et al. | |
| 6,625,028 B1 * | 9/2003 | Dove et al. | 361/707 |
| 6,633,005 B2 * | 10/2003 | Ichitsubo et al. | 174/260 |
| 7,193,320 B2 * | 3/2007 | Hosoyamada et al. | 257/738 |
| 2003/0113955 A1 * | 6/2003 | Kim et al. | 438/125 |
| 2006/0202224 A1 | 9/2006 | Lee | |
| 2007/0217221 A1 | 9/2007 | Lee et al. | |
| 2007/0290307 A1 * | 12/2007 | Lin | 257/678 |

FOREIGN PATENT DOCUMENTS

| | | |
|---|---|---|
| DE | 40 30 532 A1 | 4/1992 |
| EP | 1 603 376 A1 | 12/2005 |
| JP | A-3-204996 | 9/1991 |
| JP | A-6-120629 | 4/1994 |
| JP | A-9-83106 | 3/1997 |
| JP | A-2000-155164 | 6/2000 |
| JP | A-2003-134753 | 5/2003 |
| JP | A-2006-158152 | 6/2006 |
| WO | WO 2008/078739 A1 | 7/2008 |

OTHER PUBLICATIONS

European Search Report mailed on Dec. 15, 2009 in corresponding European Patent Application No. 09 17 0395.
Jan. 8, 2013 Japanese Office Action issued in Japanese Patent Application No. 2008-237471 (with translation).

* cited by examiner

*Primary Examiner* — Hoa C Nguyen
(74) *Attorney, Agent, or Firm* — Oliff & Berridge, PLC

(57) ABSTRACT

A multilayer circuit substrate includes: a laminated circuit portion in which conductive layers and resin insulating layers are alternately laminated; and a metal substrate portion, wherein the laminated circuit portion is fixed to the metal substrate portion so that at least part of a lower surface of the laminated circuit portion is in contact with at least part of an upper surface of the metal substrate portion. An electronic component is mounted on the metal substrate portion.

2 Claims, 7 Drawing Sheets

MULTILAYER CIRCUIT SUBSTRATE

INCORPORATION BY REFERENCE

The disclosure of Japanese Patent Application No. 2008-237471 filed on Sep. 17, 2008 including the specification, drawings and abstract is incorporated herein by reference in its entirety.

BACKGROUND OF THE INVENTION

1. Field of the Invention

The invention relates to a multilayer circuit substrate, and typically relates to a motor drive circuit substrate using the same for use in an electric power steering device.

2. Description of the Related Art

An electric power steering device for a vehicle drives a steering assist motor so as to obtain an advantageous steering assist force with respect to a steering torque applied to a steering wheel by a driver and a vehicle speed. The steering assist motor is driven by a motor drive circuit contained in an electronic control unit. When the steering assist motor is driven, the motor drive circuit controls a high power of about 500 W to 2000 W. The electronic control unit will be referred to hereinbelow as ECU.

In the above-described process, the motor drive circuit generates heat, and in order to prevent the generated heat from causing malfunction or failure of the ECU, the motor drive circuit is mounted on a circuit substrate with good thermal conductivity. For example, as shown in FIG. 13A, the motor drive circuit is mounted on a metallic circuit substrate in which a copper conductive layer 91 and a resin insulating layer 92 are formed layer by layer on an aluminum metal substrate 93 that is a heat sink.

In the circuit substrate shown in FIG. 13A, electronic components can be mounted only on one side. More specifically, electronic components can be mounted only on the conductive layer 91. Therefore, the occupation surface area of this circuit substrate in the ECU increases. Accordingly, a method of increasing the number of layers in the circuit substrate, as shown in FIG. 13B, can be considered as one of the methods for reducing the substrate surface area. In a ceramic multilayer substrate shown in FIG. 13B, a large number of copper conductive layers 91 and ceramic insulating layers 94 are laminated, an insulating resin 95 for adhesive bonding is sandwiched between the laminate and the aluminum metal substrate 93 serving as a heat sink, and joining is conducted by a hot-press joining method. Such increase in the number of layers makes it possible to decrease the length of circuit conductors, that is, wiring length. As a result, the inductance of circuit conductors can be reduced, thereby making it possible to suppress the occurrence of switching noise.

The following related art is known as the art that is associated with the invention of the application. International Patent WO 2008/078739 discloses a configuration of a multilayer circuit substrate that has a low cost and good thermal conductivity, wherein a conductive layer is formed on the inner surface by copper plating or the like and resin-filled heat-dissipating via holes are provided. Japanese Patent Application Publication No. 2006-158152 (JP-A-2006-158152) discloses a configuration in which a single-layer substrate carrying a power element in a bare chip state and a multilayer substrate carrying other elements are attached to respective heat sinks. Japanese Patent Application Publication No. 3-204996 (JP-A-3-204996) discloses a configuration in which a bare chip component is fixed to a heat spreader. Japanese Patent Application Publication No. 2000-155164 (JP-A-2000-155164) discloses a configuration of a tapered heat sink. Japanese Patent Application Publication No. 9-83106 (JP-A-9-83106) discloses a feature of forming slits in punching locations when a printed circuit substrate is processed by punching. Japanese Patent Application Publication No. 2003-134753 (JP-A-2003-134753) discloses a configuration in which a plurality of bus bars provided correspondingly to motor phases are held with gaps therebetween by an insulating holder.

As mentioned hereinabove, thermal conductivity of a multilayer circuit substrate is worse than that of a circuit substrate with a single metal layer. Therefore, a variety of measures, such as those described in the openly published documents described hereinabove, have been taken to ensure heat dissipation. In particular, in a case where an electronic component generating a larger amount of heat, such as a power Metal-Oxide-Semiconductor Field-Effect Transistor (MOSFET), is mounted on a multilayer circuit substrate, a heat sink is attached to the electronic component itself, or a heat dissipating via hole that extends vertically from the rear surface of the electronic component is formed in the multilayer circuit substrate. These conventional methods assume that the electronic components are fixedly attached by soldering or the like to a front layer surface serving as a first layer of the multilayer circuit substrate. Therefore, where the attention is focused on thermal conduction from the electronic components to a metal base located in the lowermost layer of the multilayer circuit substrate, the heat dissipation efficiency of this conduction is very difficult to improve.

SUMMARY OF THE INVENTION

Accordingly, it is an object of the invention to provide a multilayer circuit substrate in which an electronic component that generates a large amount of heat is not mounted on a front layer (first layer) surface and heat dissipation efficiency by thermal conduction from the electronic component to a metal substrate is increased.

A multilayer circuit substrate according to the first aspect of the invention includes a laminated circuit portion in which conductive layers and resin insulating layers are alternately laminated; and a metal substrate portion, wherein the laminated circuit portion is fixed to the metal substrate portion so that at least part of a lower surface of the laminated circuit portion is in contact with at least part of an upper surface of the metal substrate portion, and an electronic component is mounted on the metal substrate portion.

With the multilayer circuit substrate according to the first aspect, the electronic component that generates a large amount of heat is mounted on the metal substrate portion, rather than the laminated circuit portion, thereby making it possible to increase heat dissipation efficiency by thermal conduction from the electronic component to the metal substrate. Furthermore, such a simple configuration makes it unnecessary to form heat dissipating via holes in the laminated circuit portion or use expensive resin having high thermal conductivity. Therefore, the production cost can be reduced.

Further, in the first aspect, an opening is formed in the laminated circuit portion, and the electronic component is disposed inside the opening of the laminated circuit portion.

With such a configuration, because the electronic component mounted on the metal substrate portion is disposed inside the opening of the multilayer circuit portion, for example, wire bonding from the electronic component to the laminated circuit portion can be easily performed via this opening. In addition, because such an opening can be easily formed, the production cost can be reduced. Moreover, such a configuration can reduce the substrate size.

With such a configuration, the laminated circuit portion may be screwed or bonded with an adhesive to the metal substrate portion.

With such a configuration, because the laminated circuit portion and metal substrate portion are screwed together or bonded with an adhesive, it is not necessary to join the laminated circuit portion to the metal substrate portion of different thermal capacity by hot-press joining and the manufacturing process is simplified. Further, with such a configuration, thermal conductivity to the heat sink attached to the multilayer circuit substrate can be prevented from being degraded by warping of the substrate during cooling after hot-press joining and sufficient heat dissipation from the heat sink can be ensured.

The multilayer circuit substrate according to the second aspect of the invention includes a laminated circuit portion in which conductive layers and resin insulating layers are alternately laminated and which includes a first recess portion; a heat spreader onto which an electronic component is mounted and which is disposed in the first recess portion of the laminated circuit portion; and a metal substrate portion that is fixedly attached to the lowermost insulating layer, wherein a height of the heat spreader is set to be equal to or less than a depth of the first recess portion of the laminated circuit portion.

According to the second aspect, an electronic component that generates a large amount of heat is mounted on the heat spreader that is inserted in the first recess portion of the laminated circuit portion, rather than on the surface layer of the laminated circuit portion. As a result, heat dissipation efficiency by thermal conduction from the electronic component to the metal substrate can be greatly increased, for example, over the conventional configuration having heat dissipating via holes. Such a simple configuration makes it unnecessary to form heat-dissipating via holes of a fine structure in the multilayer circuit substrate, thereby making it possible to reduce the production cost.

In the configuration according to the second aspect, the first recess portion of the laminated circuit portion may be formed to have a depth from the uppermost conductive layer of the laminated circuit portion to the insulating layer immediately above the metal substrate portion, that is, to the lowermost insulating layer, or to the lowermost conductive layer from among the conductive layers. Further, the laminated circuit portion may be fixedly attached to the metal substrate portion by hot-press joining, and the heat spreader may be set to a height that is equal to or less than the depth of the first recess portion after the hot-press joining. A second recess portion on which the electronic component will be mounted may be formed in the heat spreader, and a depth of the second recess portion of the heat spreader may be set to be larger than the height of the electronic component.

According to the above-described aspect, when the laminated circuit portion is hot-press joined to the metal substrate portion, the heat spreader on which the electronic component has been mounted does not hinder the hot-press joining process. Furthermore, the electronic component is not fractured by hot-press joining and the heat spreader can be adequately hot-press joined.

BRIEF DESCRIPTION OF THE DRAWINGS

The features, advantages, and technical and industrial significance of this invention will be described in the following detailed description of example embodiments of the invention with reference to the accompanying drawings, in which like numerals denote like elements, and wherein.

DETAILED DESCRIPTION OF EMBODIMENTS

The multilayer circuit substrate according to the first embodiment is a motor drive circuit substrate for an electric power steering device, and this motor drive circuit substrate is contained and used in an ECU for an electric power steering device serving as an ECU.

The ECU includes a motor control circuit that calculates the amount of drive current that will be supplied to a steering assist motor and a motor drive circuit that controls a high current and drives the steering assist motor. In the motor control circuit, the amount of heat generated when the circuit operates is small and the current flowing therein is also small, whereas in the motor drive circuit, the amount of heat generated when the circuit operates is large and the current flowing therein is also large. Such a motor drive circuit is mounted on a motor drive circuit substrate, and the motor control circuit is mounted on a separate circuit substrate. These two circuit substrates are arranged side by side or disposed as a two-stage stack inside the ECU. The structure of the multilayer circuit substrate that is the motor drive circuit substrate will be described below with reference to FIGS. 1 to 4.

Figure 1:
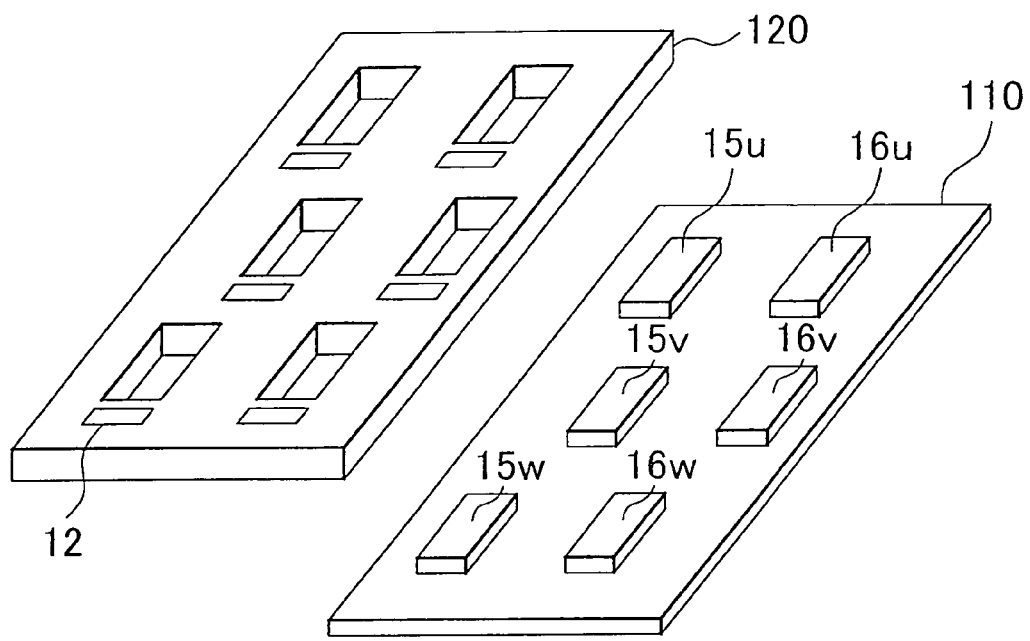
FIG. 1 is an exploded perspective view illustrating the structure of each layer in the multilayer circuit substrate according to the first embodiment of the invention.
Figure 2:
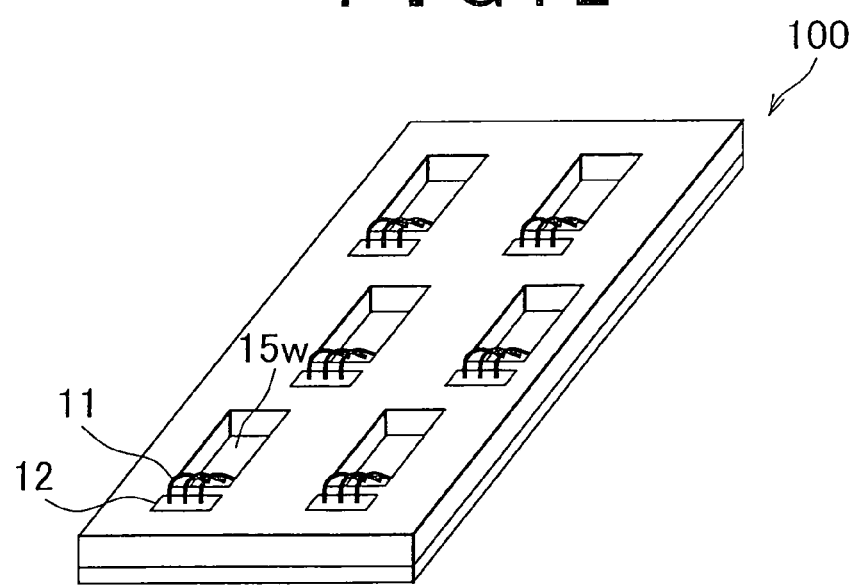
FIG. 2 is an external perspective view of the multilayer circuit substrate in the first embodiment.
Figure 3:
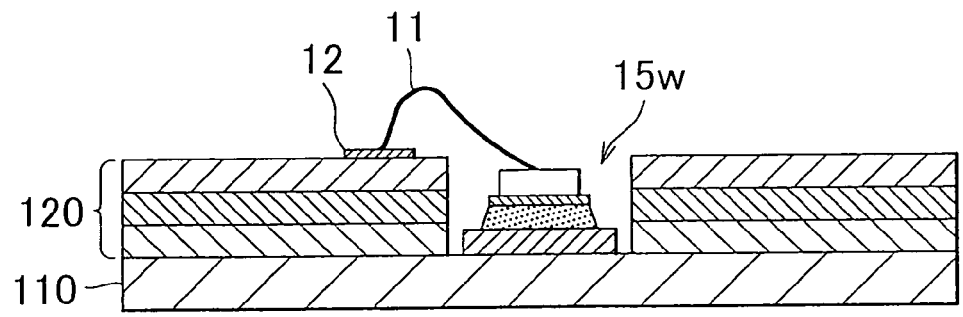
FIG. 3 is a cross-sectional view of a portion of the multilayer circuit substrate in the first embodiment.
Figure 4:
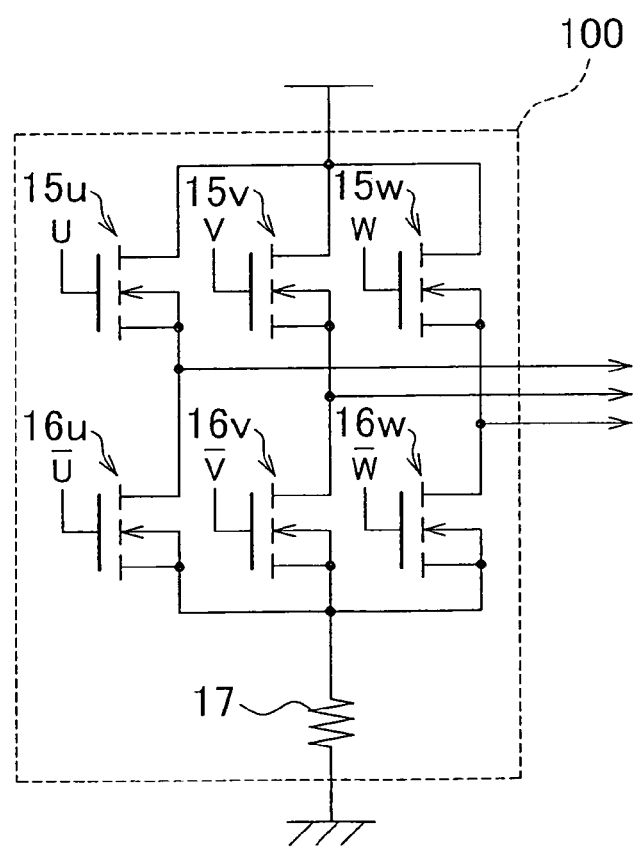
FIG. 4 is a circuit configuration of the multilayer circuit substrate in the first embodiment.

FIG. 1 is an exploded perspective view illustrating the structure of each layer in the multilayer circuit substrate according to the first embodiment of the invention. FIG. 2 is an external perspective view of the multilayer circuit substrate. FIG. 3 is a cross-sectional view of a portion of the multilayer circuit substrate. FIG. 4 is a circuit configuration of the circuit substrate.

A multilayer circuit substrate 100 shown in the figures is formed by bonding a single-layer circuit substrate portion 110 and a laminated circuit portion 120 with an adhesive composed, for example, of an epoxy resin. The multilayer circuit substrate may be also formed by fixing the circuit portions such as screwing them together. The single-layer circuit substrate portion 110 is a circuit substrate composed of one layer of a metal such as aluminum. For example, electronic components that generate a large amount of heat, such as semiconductors e.g. Field-Effect Transistor (FET), or shunt resistors are mounted on the single-layer circuit substrate 110. Predetermined wirings that electrically connect these electronic components are also provided on the surface of the single-layer circuit substrate portion 110.

The laminated circuit portion 120 has a three-layer structure in which two conductive layers and an insulating layer provided therebetween are hot-press joined together. The conductive layers are from a metal with a high electric conductivity, such as copper, and the insulating layer is from the so-called prepreg, which is a synthetic material obtained by impregnating glass fibers with an insulating resin material.

The above-described structure will be explained below in greater detail. A resistor 17 and six MOSFET 15$u$, 15$v$, 15$w$, 16$u$, 16$v$, and 16$w$ shown in FIG. 4 are placed on the surface of the single-layer circuit substrate portion 110 of the multilayer circuit substrate 100. The front surface layer (upper surface) of the six MOSFET is exposed to the outside, and the corresponding positions of the laminated circuit portion 120 are opened so as to accommodate the portions (three dimension structural components) that protrude from the substrate surface of the six MOSFET. Upper connection terminals of the MOSFET and wiring conductors 12 provided in the predetermined locations of the first layer (front surface layer) of the laminated circuit portion 120 are wire-bonded by three aluminum wires 11 via the openings. With such a configuration, the heat generated in the laminated circuit portion 120 is dissipated from a heat sink (not shown in the figure) or the like adhesively bonded to the rear surface of the single-layer circuit substrate portion 110 via the single-layer circuit substrate portion 110, which has good thermal conductivity. Further, because electronic components that generate a large amount of heat, such as MOSFET, are directly mounted on the single-layer circuit substrate portion 110, heat is dissipated more efficiently than in a case where such electronic components are mounted on the front surface layer of the laminated circuit portion 120.

Further, in the laminated circuit portion 120, a power source wiring, a ground wiring, and other wirings are provided over three layers. As shown in FIG. 4, these wirings connect the drain terminals of the MOSFET 15$u$, 15$v$, and 15$w$ contained in the motor drive circuit to a plus electrode of a power source unit (not shown in the figure) and connect the source terminals of these transistors to the input terminals of corresponding motor phases. Further, the source terminals of the MOSFET 16$u$, 16$v$, and 16$w$ are connected to a minus electrode acting as a ground electrode of the power source unit (not shown in the figure) via the resistor 17, and the drain terminals of these transistors are connected to the input terminals of corresponding motor phases.

A sensor for electric current detection may be mounted on the front surface layer of the single layer circuit substrate portion 110 in the multilayer circuit substrate 100, which is a motor drive circuit substrate, and electronic components that generate a small amount of heat, such as a coil for noise removal, a relay for disconnecting the power source, and a relay for motor phase current shut-down, may be mounted on the front surface layer of the laminated circuit portion 120.

An opening is provided in the laminated circuit portion 120, but providing the opening is not necessary in a case of configuration in which heat dissipation from the laminated circuit portion 120 is ensured by contact of the rear surface of the laminated circuit portion 120 with the front surface of the single-layer circuit substrate portion 110. For example, a structure may be used in which a recess portion of a size sufficient to accommodate the three dimension structural components of the MOSFET may be provided. The configuration in which an opening is provided, as described hereinabove, is preferred because wiring bonding to the circuit conductor of the laminated circuit portion 120 can be easily performed through the opening, and the opening itself can be easily formed.

Furthermore, a configuration may be employed in which the recess portion that accommodates the three dimension structural components of the MOSFET is provided in the single-layer circuit substrate portion 110, or the rear surface of the laminated circuit portion 120 is brought into contact with the front surface of the single-layer circuit substrate portion 110 via a thermally conductive material by disposing or coating a thermally conductive material such as a thermally conductive resin on the front surface of the single-layer circuit substrate portion 110 till the surface layer (uppermost surface) of the MOSFET. In these cases, it is necessary, for example, to provide an electrode pad in a rear surface position of the laminated circuit portion 120 connected to MOSFET and electrically connect the electrode pad to the upper surface of the MOSFET by soldering or the like, instead of wire bonding.

It is also possible to use a configuration in which the single-layer circuit substrate portion 110 is omitted, a MOSFET, which is an electronic component that generates a large amount of heat, is directly attached to a heat sink that has no wiring layer by sandwiching an insulating layer or the like, and wiring is performed by wire bonding or with a circuit conductor of the laminated circuit portion 120, instead of the wiring contained in the single-layer circuit substrate portion 110.

As described hereinabove, in the first embodiment, the wiring or electronic component that generates a small amount of heat is provided on the laminated circuit portion 120 and an electronic component that generates a large amount of heat is directly mounted on a metallic single-layer circuit substrate portion 110, rather than on the laminated circuit portion 120, thereby making it possible to increase heat dissipation efficiency by thermal conduction from the electronic component to the metal substrate.

Furthermore, because this simple configuration does not require to form heat dissipating via holes in the laminated circuit portion 120 or use an expensive resin with a high thermal conductivity, the production cost can be reduced. In addition, because the single-layer circuit substrate portion 110 and laminated circuit portion 120 can be fixed with an adhesive or screwed together, the configuration can be manufactured in a simple manner and it is not necessary to attach fixedly the laminated circuit portion 120 to the single-layer circuit substrate portion 110, which is a metal substrate of different thermal capacity, by hot-press joining. As a result, thermal conductivity to the heat sink attached to the multilayer circuit substrate can be prevented from being degraded by warping of the substrate during cooling after hot-press joining and sufficient heat dissipation from the heat sink can be ensured.

Similarly to the first embodiment, a multilayer circuit substrate of the second embodiment is a motor drive circuit substrate for an electric power steering device, this motor drive circuit substrate being contained and used in an ECU for an electric power steering device as an ECU. The structure of the multilayer circuit substrate, which is the motor drive circuit substrate, will be described below with reference to FIGS. 5 to 7.

Figure 5:
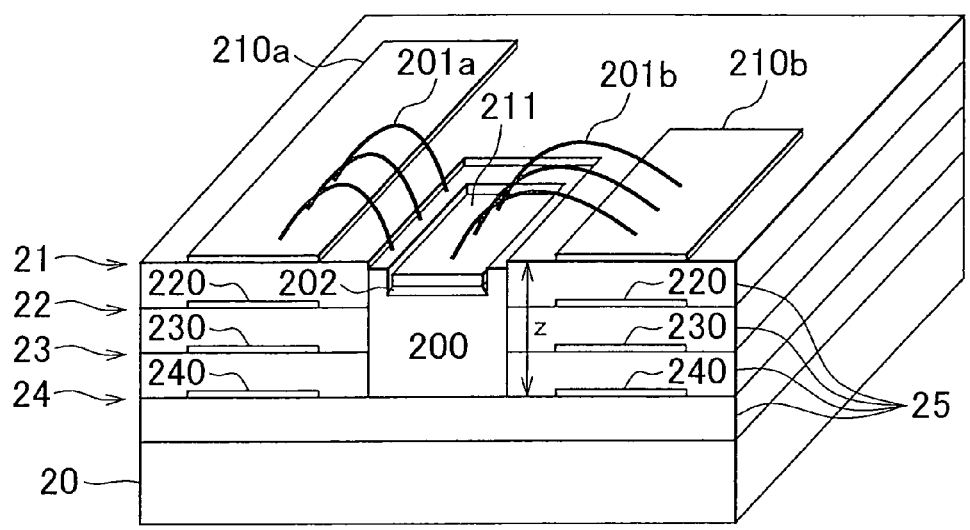
FIG. 5 is a perspective view illustrating a cross-sectional structure of each layer in the multilayer circuit substrate in the second embodiment of the invention.
Figure 6:
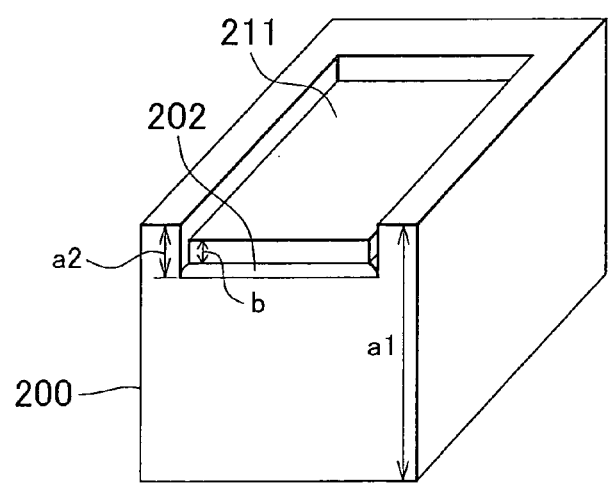
FIG. 6 is an external perspective view of a heat spreader and a semiconductor element contained in the multilayer circuit substrate in the second embodiment.
Figure 7:
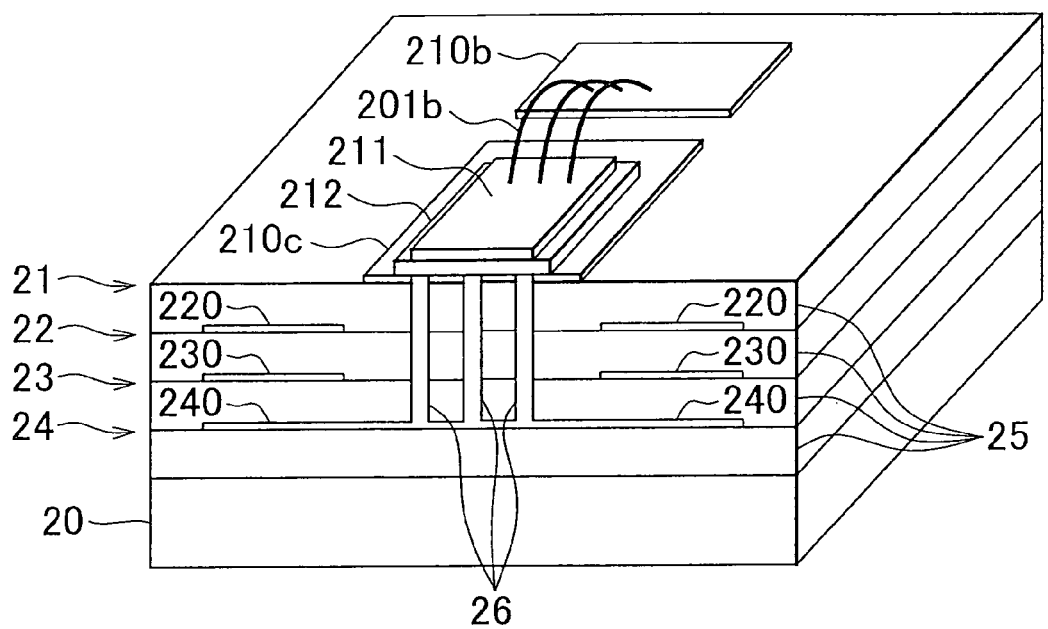
FIG. 7 is a perspective view illustrating a cross-sectional structure of each layer in the conventional multilayer circuit substrate.

FIG. 5 is a perspective view illustrating a cross-sectional structure of each layer in the multilayer circuit substrate of the second embodiment of the invention. FIG. 6 is an external perspective view of a heat spreader and a semiconductor element contained in the multilayer circuit substrate. FIG. 7 is a perspective view illustrating a cross-sectional structure of each layer in the multilayer circuit substrate of the related art.

The multilayer circuit substrate shown in FIG. 5 is provided with a laminated circuit portion in which conductive layers and insulating layers are alternately laminated by sandwiching insulating layers 25 between the conductive layers from the first conductive layer 21 to the fourth conductive layer 24, and a metal substrate 20 that is attached from below to the laminated circuit portion for heat dissipation.

The metal substrate (metal base) 20 is formed from a metal with a good thermal conductivity, such as aluminum, and functions as a heat sink. The metal substrate 20 is provided to be in contact with the lowermost insulating layer from among the insulating layers 25 and hot-press joined to this lowermost insulating layer.

The first to fourth conductive layers 21 to 24 constituting the laminated circuit portion include circuit patterns formed from copper or the like and the insulating layers 25 are from the so-called prepregs, which are synthetic materials obtained by impregnating glass fibers with an insulating resin material. Instead of copper, the first to fourth conductive layer 21 to 24 may be formed from a metal such as aluminum, nickel, silver, titanium, and gold, alloys of these metals, or these metals plated with nickel or a nickel-gold alloy. These metals, alloys, and laminated films may be formed by a pressure bonding method, a sputtering method, a chemical vapor deposition method, a vacuum vapor deposition method, a thick-film printing method, or a combination thereof.

As shown in FIG. 5, the laminated circuit portion is formed by alternately laminating and hot-press joining the first to fourth conductive layers 21 to 24 and a plurality of insulating layers 25. The conductive layer 21, which is the uppermost layer, includes first and second circuit patterns 210$a$ and 210$b$. Likewise, the second layer 22 to the fourth layer 24 include the corresponding circuit patterns 220 to 240. These circuit patterns can be formed by a conventional processing, for example, by forming an etching resist and conducting etching.

Further, a first recess portion that has a depth z from the first conductive layer 21 to a location directly above the insulating layer that is the lowermost insulating layer 25 is formed in the laminated circuit portion, and a heat spreader 200 made for copper or another metal with a high thermal conductivity is fitted in the first recess portion. An electronic component that generates heat, in this case a MOSFET 211, which is a semiconductor element, is mounted on the heat spreader 200 and soldered to the heat spreader 200 with a high-temperature solder 202. The high-temperature solder 202 is a solder that has a melting point higher than that of the usual solder and does not melt when other electronic component are soldered on the circuit pattern of the first conductive layer 21 with the usual solder. Therefore, this high-temperature solder is advantageous for fixedly joining the MOSFET 211 to the heat spreader 200.

Thus, the multilayer circuit substrate of the embodiment is formed by a process including the steps of: (1) forming a multilayer circuit substrate by the above-described method; (2) then subjecting the multilayer circuit substrate to counter boring so as to form the recess portion; (3) press-fitting the heat spreader 200 to which the MOSFET 211 has been soldered by the high-temperature solder 202 in the first recess portion; (4) then, hot-press joining an insulating layer serving as an adhesive layer that is a lowermost layer of the laminated circuit portion to the metal substrate 20; and (5) finally soldering other electronic components and wire bonding the upper portion of the heat spreader 200 and the first circuit pattern 210$a$ to the upper portion of the MOSFET 211 and the second circuit pattern 210$b$ by three aluminum wires 201$a$, 201$b$.

It is also possible to omit a process of wire bonding the upper portion of the heat spreader 200 to the first circuit pattern 210$a$ and use various conventional methods for electric connection, for example, press joining or soldering the bottom surface of the heat spreader 200 to the circuit pattern of the fourth conductive layer 24. In the explanation above, the insulating layer that is the lowermost layer of the laminated circuit portion functions as an adhesive layer, but in a case where the metal substrate 20 is adhesively joined via a separate adhesive layer, this adhesive layer becomes the insulating layer that is the lowermost layer of the laminated circuit portion.

Because the heat spreader 200 is thus press fitted after the MOSFET 211 has been soldered, for example, where the MOSFET 211 is mounted on the heat spreader 200 in the form of a rectangular parallelepiped, the MOSFET 211 can be fractured by the applied pressure. Accordingly, as shown in FIG. 6, the heat spreader 200 is counter bored and a second recess portion is formed so as to accommodate the MOSFET 211 and eliminate the effect of pressure generated when the heat spreader 200 is pressed in. Therefore, a depth a2 of the second recess portion is somewhat (for example, by 200 μm or more) larger that the length obtained by adding the thickness of the high-temperature solder to the height (thickness) b of the MOSFET 211. Thus, the relationship of a2>b is valid. Further, it is desirable that the height a1 of the heat spreader 200 itself be equal to or somewhat less than the depth z from the first conductive layer 21 of the multilayer circuit substrate after the metal substrate 20 has been hot-press joined thereto to the location directly above the insulating layer 25, which is the lowermost layer. This is because where the height a1 of the heat spreader 200 itself is larger than the depth z, the heat spreader 200 becomes an obstacle when the metal substrate 20 is hot-press joined. Where the height a1 of the heat spreader 200 itself is significantly less than the depth z, the heat spreader 200 itself is difficult to join by hot-press joining to the metal substrate 20 via the insulating layer 25. Thus, the relationship of a1≦z is valid.

As described hereinabove, the shape of the heat spreader 200 is significantly different from that of the related art illustrated by FIG. 7. The functions of the heat spreader 200 will be explained below in comparison with the configuration of the multilayer circuit substrate according to the related art that is illustrated by FIG. 7. In the multilayer circuit substrate shown in FIG. 7, constituent elements identical to those shown in FIG. 6 are denoted by identical reference numerals and explanation thereof is omitted.

Through holes 26 shown in FIG. 7 are constituent elements that are omitted in the multilayer circuit substrate shown in FIG. 6. These through holes are interlayer connection holes formed by a conventional method in the thickness direction of the first to fourth conductive layers 21 to 24 and a plurality of insulating layers 25. A conductive layer such as a metal plated layer obtained by copper plating or the like is formed on the inner surface of these holes, and the inside thereof is filled with a resin. Because of such a through structure, the through holes 26 have a heat dissipation function that ensures effective conduction of heat generated in the MOSFET 211, which is mounted on the circuit pattern 210c contained in the first conductive layer 21, with the conventional heat spreader 212 being interposed between the circuit pattern and the transistor, to the insulating layer located directly on the metal substrate 20, that is, to the insulating layer that is the lowermost layer.

The heat dissipation effect produced by the through holes 26 formed in the multilayer circuit substrate according to the related art that is illustrated by FIG. 7 is to a certain degree lower than the heat dissipation effect demonstrated by the heat spreader 200 that is provided in the multilayer circuit substrate of the embodiment. Thus, as shown in FIG. 5 or 6, the heat spreader 200 directly transmits heat generated in the MOSFET 211 to the insulating layer located directly above the metal substrate 20, that is, to the insulating layer that is the lowermost layer. Therefore, the heat dissipation function is greatly superior to that of the small-diameter holes such as the through holes.

As described hereinabove, in the second embodiment, the electronic component that generates a large amount of heat, such as the MOSFET 211, is mounted on the insulating layer located directly above the metal substrate 20, that is, on the heat spreader 200 having the height a1 that enables pressure joining to the insulating layer that is the lowermost layer, rather than to the surface layer of the multilayer circuit substrate. As a result, heat dissipation efficiency provided for by thermal conduction from the electronic component to the metal substrate can be greatly increased over that attained in the case of the heat dissipating via holes. Furthermore, such a simple configuration makes it unnecessary to form heat dissipating via holes of a fine structure in the multilayer circuit substrate. Therefore, the production cost can be reduced.

Figure 8:
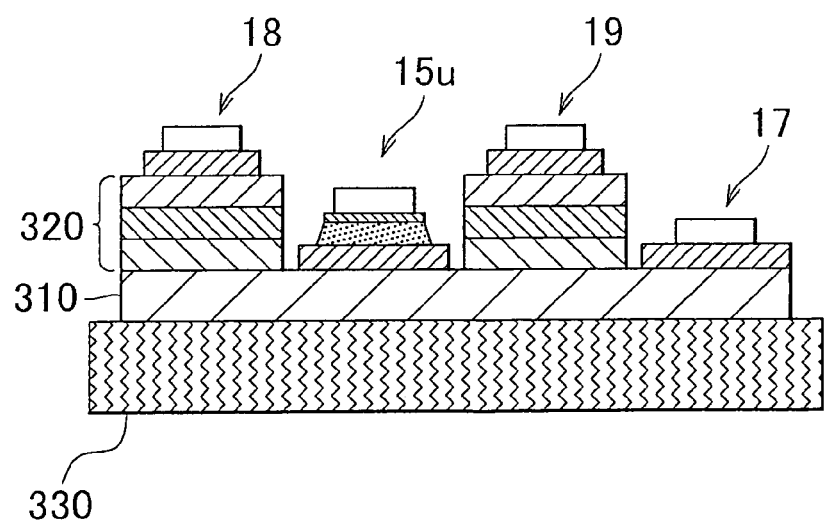
FIG. 8 is a cross-sectional view of the multilayer circuit substrate of a modification example of the first embodiment.

A modification example of the first embodiment will be explained below. In the above-described first embodiment, a configuration is used in which a wiring or an electronic component that generates a small amount of heat is provided on the laminated circuit portion 120, an electronic component that generates a large amount of heat is mounted on the metallic single-layer circuit substrate portion 110, and the laminated circuit portion 120 and single-layer circuit substrate portion 110 are fixed by screwing them together. However, it is not necessary to use only one laminated circuit portion. Thus, a multilayer circuit substrate may be used of a configuration in which a plurality of laminated circuit portions are fixed to one single-layer circuit substrate portion as shown in FIG. 8. With such a configuration, heat dissipation efficiency provided for by thermal conductivity from the electronic component to the metal substrate can be also increased in the same manner as in the configuration of the first embodiment. This variation example will be explained below in greater detail with reference to FIG. 8.

FIG. 8 is a cross-sectional view of a multilayer circuit substrate according to the variation example of the first embodiment. As shown in FIG. 8, similarly to the first embodiment, this multilayer circuit substrate is a motor drive circuit substrate for an electric power steering device and is formed by joining, for example, by soldering, a single-layer circuit substrate portion 310 composed of a metal such as aluminum and a laminated circuit portion 320 that has a laminated structure similar to that of the first embodiment. Thus, electrode pads are provided on the bottom surface of the laminated circuit portion 320, and these pads are connected by soldering to the single-layer circuit substrate portion 310. The single-layer circuit substrate portion 310 and laminated circuit portion 320 may be also joined by an adhesive and electrically connected by wire bonding or the like.

Similarly to the first embodiment, electronic components that generate a large amount of heat, more specifically a resistor 17 and six MOSFET 15u, 15v, 15w, 16u, 16v, and 16w are mounted on the single-layer circuit substrate portion 310. Only the MOSFET 15u is shown in FIG. 8. These MOSFET are wire-bonded with an aluminum wire or the like to wiring conductors provided in predetermined locations of the first layer (surface layer) of the laminated circuit portion 320 (this wire bonding is not shown in the figure). In addition to an electric power wiring, a ground wiring, and other wirings, an electronic component that generates a small amount of heat, in this case a chip resistor 18 or a chip capacitor 19, is mounted on the laminated circuit portion 320.

With such a structure, heat generated in the laminated circuit portion 320 is dissipated, via the single-layer circuit substrate portion 310 that has good thermal conductivity, from a heat sink 330 that has a high thermal capacity and is bonded to the rear surface of the single-layer circuit substrate portion 310. Because the electronic components that generate a large amount of heat, such as MOSFET, are directly mounted on the single-layer circuit substrate portion 310, heat is dissipated with an efficiency better than that in the case these electronic components are mounted on the front surface layer of the laminated circuit portion 320.

As mentioned hereinabove, the above-described configuration makes it possible to increase heat dissipation efficiency by thermal conduction from the electronic components to the metal substrate. Further, similarly to the first embodiment, because it is not necessary to form a heat dissipating via hole in the laminated circuit portion 320, the production cost can be reduced. In addition, because it is not necessary to attach the single-layer circuit substrate portion 310 and laminated circuit portion 320 fixedly to each other by hot-press joining, the heat can be sufficiently dissipated from the heat sink 330, without the substrate warping during cooling.

Another variation example relating to a heat sink will be explained below. In the aforedescribed first and second embodiment, a configuration is used in which the heat dissipation effect is increased by directly mounting electronic elements that generate a larger amount of heat, such as MOSFET, on a metal substrate, but the shape of a heat sink that dissipates the heat transferred to the metal substrate to the environment has not been described in details. Here, a heat sink having a shape that facilitates the arrangement of an electrolytic capacitor, which is difficult to arrange in a compact manner, and makes it possible to increase further the heat dissipation efficiency in a motor drive circuit substrate for an electric power steering device will be explained below with reference to FIGS. 9 and 10.

Figure 9:
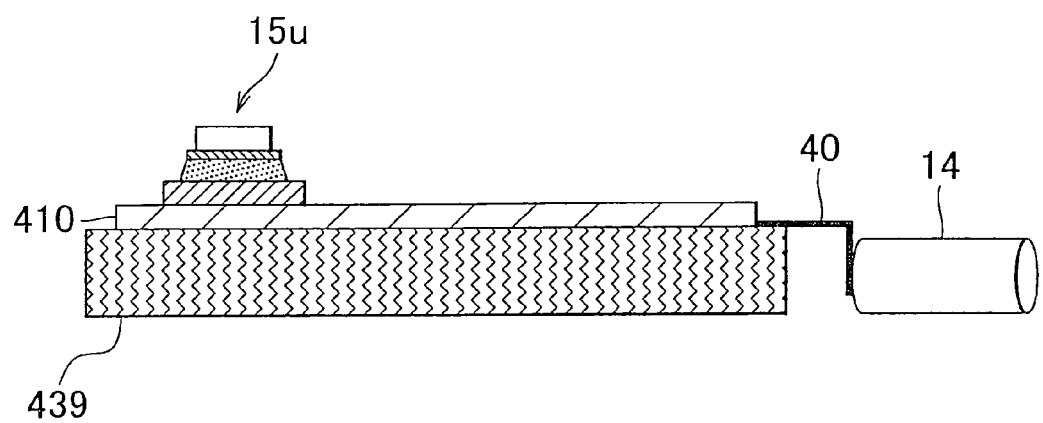
FIG. 9 is a cross-sectional view illustrating the arrangement locations of a heat sink and an electrolytic capacitor in the conventional motor drive circuit substrate.

FIG. 9 is a cross-sectional view illustrating the arrangement positions of a heat sink and an electrolytic capacitor in a motor drive circuit substrate according to the related art. As shown in FIG. 9, an electrolytic capacitor 14 is connected to a multilayer circuit substrate 410 by a bus bar 40, and the rear surface of the multilayer circuit substrate 410 is fixed to the heat sink 439. Further, a MOSFET 15u that generates a large amount of heat is mounted on the multilayer circuit substrate 410. Other elements that generate a large amount of heat (not shown in the figure) are also disposed in the vicinity of the transistor.

The electrolytic capacitor 14 is preferably disposed as close to the power source unit as possible. Because the frequency of the pulse width modulation (PWM) signal applied to the motor drive circuit is several tens of kilohertz, this frequency induces current fluctuations. As a result, unnecessary power fluctuations occur due to an impedance on the current path. By reducing this impedance, the electrolytic capacitor 14 inhibits voltage fluctuations. Therefore, it is preferred that the electrolytic capacitor be disposed close to the power source, but where the electrolytic capacitor is mounted vertically on the surface of the multilayer circuit substrate 410 due to the elongated cylindrical shape of the electrolytic capacitor, the entire size (height) of the configuration is increased and the configuration is difficult to miniaturize. Accordingly, the electrolytic capacitor 14 is most often attached via a bas bar 40 in a location such as shown in FIG. 9, so that the position of the side surface of the electrolytic capacitor matches the bottom surface of the heat sink 439 that is attached to a motor case or the like.

However, where the electrolytic capacitor 14 is connected to the multilayer circuit substrate 410 by the bas bar 40, the path to the power source becomes longer and impedance increases. As a result, a sufficient effect of inhibiting voltage fluctuations sometimes cannot be demonstrated. Accordingly, by using a heat sink of a shape different from that of the related art, the electrolytic capacitor 14 is directly connected to the multilayer circuit substrate 410, as shown in FIG. 10.

Figure 10:
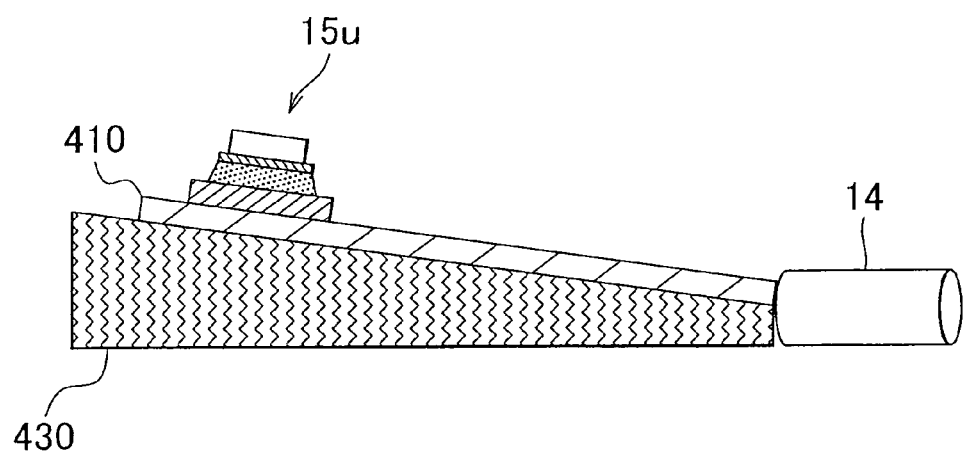
FIG. 10 is a cross-sectional view illustrating the attachment positions of an electrolytic capacitor and a heat sink that has a specific shape different from that of the conventional heat sinks.

FIG. 10 is a cross-sectional view illustrating the attachment position of the electrolytic capacitor and the heat sink that has a shape different from that of the related art. As shown in FIG. 10, the heat sink 430 that has a shape different from that of the related art has a tapered shape such that a portion connected to the electrolytic capacitor 14 is thin, whereas a portion located directly below an electronic component that generates a large amount of heat, such as MOSFET 15u, is thick. Thus, one end portion of the heat sink 430 has a shape such that a rear surface thereof and the side surface of the electrolytic capacitor 14 are at the same height, and the height of this one end portion is such that a terminal led out from the electrolytic capacitor 14 can be directly soldered to a wiring conductor on the multilayer circuit substrate 410 mounted on the heat sink 430.

With such a configuration, the electrolytic capacitor 14 can be directly connected to the multilayer circuit substrate 410 without using a bus bar. Therefore, the connection path is shortened and the effect of inhibiting voltage fluctuations can be increased. Furthermore because the heat sink has a shape such that the portion thereof located directly below the mounted electronic components that generate a large amount of heat, such as the MOSFET 15u, is thick, so that the heat capacity of the heat sink is not decreased by the thin portion described above, the heat transferred from these electronic components can be diffused and dissipated more efficiently than in the case of the conventional heat sink 439. The structure of the circuit substrate attached to such a heat sink 430 is not necessarily that of a multilayer circuit substrate similar to that of the above-described embodiments and may be a conventional circuit substrate, for example, a single-layer circuit substrate.

A configuration example of a multilayer circuit substrate that demonstrates an effect of inhibiting voltage fluctuations, as in the above-described variation example of the first embodiment, and has a laminated circuit portion of a structure different from that of the above-described embodiments will be described below with reference to FIG. 11.

Figure 11:
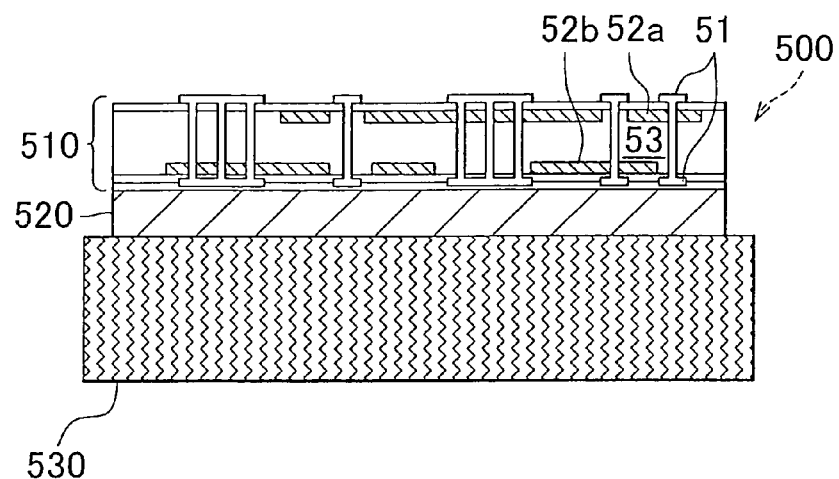
FIG. 11 is a cross-sectional view of a multilayer circuit substrate of a structure different from those of the above-described embodiments.

FIG. 11 is a cross-sectional view illustrating a multilayer circuit substrate of a structure different from that of the above-described embodiments. As shown in FIG. 11, this multilayer circuit substrate 500 is composed of a laminated circuit portion 510 that has a structure different from that of the above-described embodiments and a metal substrate 520 made from aluminum. A front surface (upper surface) of a heat sink 530 is attached to be in contact with the rear surface (lower surface) of the metal substrate 520.

The laminated circuit portion 510 is similar to the laminated circuit portions of the above-described embodiments in that it has a laminated structure of insulating resin layers and conductive layers, but this structure is that of a resin insert molded part in which a solid circuit conductor (referred to hereinbelow as a power source pattern) 52a that has a wide surface area and constitutes a power source line and a solid circuit conductor (referred to hereinbelow as a ground (GND) pattern) 52b that has a wide surface area and constitutes a ground line are configured by a bas bar with a thickness of, for example, about 1 mm.

Thus, a space between the power source pattern 52a and GND pattern 52b shown in FIG. 11 is filled with a molding resin 53 that is an insulating resin, and the power source pattern 52a and GND pattern 52b can be formed by a bus bar of a thickness that is difficult to form in the usual process of manufacturing a laminated circuit portion.

An insulating layer (adhesive layer) is bonded to both surfaces of a molded part that is resin-insert molded by filling the space between the power source pattern 52a and GND pattern 52b with the molding resin 53. The respective copper foils are pasted on the insulating layers (adhesive layers) on both surfaces of the molded part, and a circuit pattern 51 is formed by conducting etching so as to obtain a predetermined shape.

By forming the power source pattern 52a and GND pattern 52b of a certain thickness as described above, it is possible to decrease the impedance of the power source line and ground line. Therefore, the above-descried unnecessary voltage fluctuations that occur correspondingly to the frequency of the PWM signal applied to the motor drive circuit can be inhibited.

Further, in a case where the multilayer circuit substrates of the above-described embodiments are manufactured, a plurality of multilayer circuit substrates that have identical circuit capacity are typically formed in one base substrate and the base substrate is cut into the multilayer circuit substrates in the final process. More specifically, a plurality of multilayer circuit substrates are typically manufactured by die cutting.

In order to prevent the defects such as chipping of circuit portions of the multilayer circuit substrates from occurring during die cutting, a sufficient clearance distance has to be provided from the cutting positions to the circuit conductors at the very end of the multilayer circuit substrates. However, where a large clearance is thus provided, the size of each multilayer circuit substrate is increased and wasted portions are also increased and the production cost rises. A configuration of the base substrate that makes it possible to reduce the clearance will be explained below with reference to FIG. 12.

Figure 12:
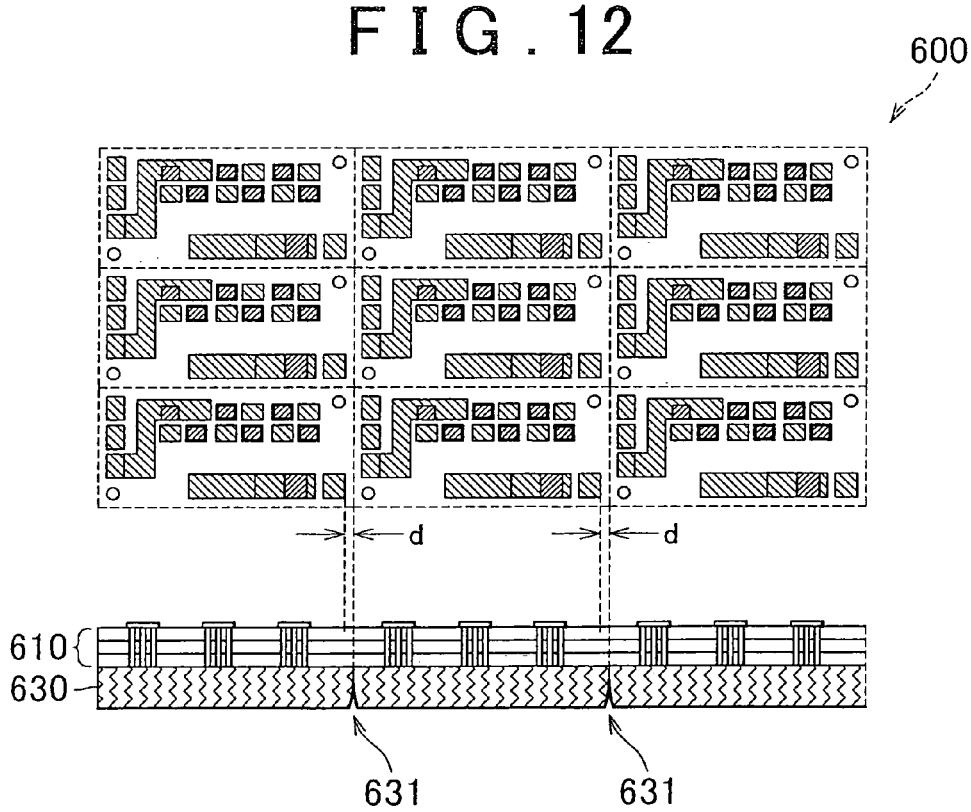
FIG. 12 shows a schematic plan view and a cross-sectional view of a base substrate having a plurality of multilayer circuit substrates.
Figure 13A:
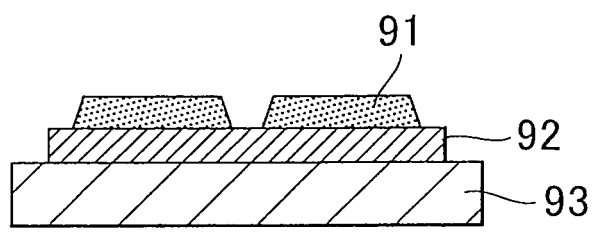
FIG. 13A is a cross-sectional view illustrating the configuration of a multilayer circuit substrate according to the related art.
Figure 13B:
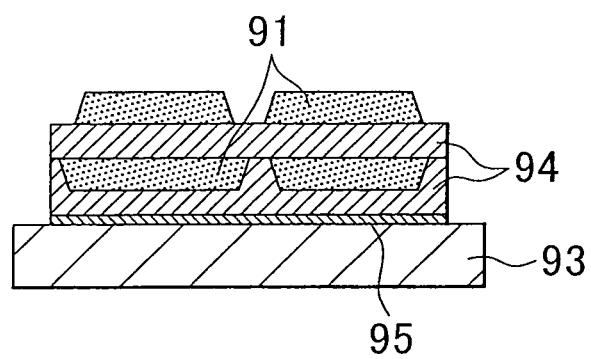
FIG. 13B is a cross-sectional view illustrating the configuration of a multilayer circuit substrate according to the related art.

FIG. 12 shows a schematic plan view and a cross-sectional view of a base substrate including a plurality of multilayer circuit substrates. The positions of circuit conductors and through holes in the figure are shown schematically; they are different from the actual positions. As shown in FIG. 12, the base substrate 600 includes a plurality of multilayer circuit substrates, and each multilayer circuit substrate is composed of a laminated circuit portion 610 and a metal substrate (metal base) 630 similar to those of the above-described embodiments. Slits 631 are formed in predetermined cutting positions of the metal substrate 630.

The base substrate 600 is processed by: (1) forming a plurality of laminated circuit portions 610 in the same manner as in the embodiments; (2) forming slits such as shown in FIG. 12 with a cutter, router, or microcutter in predetermined cutting positions of the metal substrate 630; (3) then hot-press joining the lower surface (rear surface) of the laminated circuit portion 610 to the upper surface (front surface) of the metal substrate 630 where the slits have been formed; and (4) finally die cutting the base substrate 600 formed as described hereinabove. In the die cutting process, a force for cutting is applied in a concentrated manner to the positions where the slits 631 have been formed. Therefore, cutting in the predetermined cutting positions can be accurately conducted even by applying a comparatively weak force to the metal substrate 630. Therefore, because it is not necessary to apply a strong force to the multilayer circuit substrate, it is possible to prevent the occurrence of defects such as chipping in the circuit portions of the multilayer circuit substrate.

Thus, by forming the slits in the base substrate 600, it is possible to decrease the clearance distance d shown in FIG. 12. Therefore, the size of each multilayer circuit substrate can be further reduced and the wasted portion can be decreased in size, thereby making it possible to reduce the production cost.

What is claimed is:

1. A multilayer circuit substrate comprising:
    a laminated circuit portion in which conductive layers and resin insulating layers are alternately laminated, and which includes a first recess portion;
    a metallic heat spreader onto which an electronic component is mounted, and which is disposed in the first recess portion of the laminated circuit portion; and
    a metal substrate portion that is fixedly attached to a lowermost insulating layer, wherein:
    a height of the heat spreader is set to be equal to or less than a depth of the first recess portion of the laminated circuit portion, and
    the first recess portion of the laminated circuit portion is formed to have a depth from an uppermost conductive layer from among the conductive layers of the laminated circuit portion to a location directly above the lowermost insulating layer from among the insulating layers or directly above the lowermost conductive layer from among the conductive layers.

2. The multilayer circuit substrate according to claim 1, wherein
    the laminated circuit portion is fixedly attached to the metal substrate portion by hot-press joining, and the heat spreader is set to a height that is equal to or less than the depth of the first recess portion after the hot-press joining.

* * * * *